（12） United States Patent
Choi et al.

(10) Patent No.: US 10,480,062 B2
(45) Date of Patent: Nov. 19, 2019

(54) SPUTTERING APPARATUS AND SPUTTERING METHOD USING THE SAME

(71) Applicant: SAMSUNG DISPLAY CO., LTD., Yongin-si, Gyeonggi-do (KR)

(72) Inventors: Seungho Choi, Suwon-si (KR); Haeyoung Yoo, Asan-si (KR); Kanghee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 328 days.

(21) Appl. No.: 15/395,274

(22) Filed: Dec. 30, 2016

(65) Prior Publication Data
US 2017/0342547 A1 Nov. 30, 2017

(30) Foreign Application Priority Data
May 25, 2016 (KR) .................. 10-2016-0064237

(51) Int. Cl.
H01J 37/34 (2006.01)
C23C 14/35 (2006.01)
(Continued)

(52) U.S. Cl.
CPC ......... *C23C 14/352* (2013.01); *H01F 7/0273* (2013.01); *H01J 37/32715* (2013.01);
(Continued)

(58) Field of Classification Search
CPC ... C23C 14/0036; C23C 14/35; C23C 14/352; C23C 14/54; H01J 37/32715;
(Continued)

(56) References Cited

U.S. PATENT DOCUMENTS 5,106,474 A * 4/1992 Dickey ................ C23C 14/564
204/298.06
6,156,172 A 12/2000 Kadokura
2011/0127157 A1* 6/2011 Bellido-Gonzalez ......................
H01J 37/3405
204/192.25

FOREIGN PATENT DOCUMENTS

JP 2007-231401 A 9/2007
JP 2008-1957 * 1/2008
(Continued)

OTHER PUBLICATIONS

Machine Translation JP 2008-1957 (Year: 2008).*
Machine Translation JP 2009-293089 (Year: 2009).*
Machine Translation JP 2010-13724 (Year: 2010).*

Primary Examiner — Rodney G McDonald
(74) Attorney, Agent, or Firm — Lewis Roca Rothgerber Christie LLP

(57) ABSTRACT

A sputtering apparatus includes a substrate holder, a first counterpart target area, a second counterpart target area, and a power supply. The first counterpart target area includes a first target and at least one first magnetic part and operates to form a magnetic field in a first plasma area adjacent to the first target. The second counterpart target area includes a second target and at least one second magnetic part and operates to form a magnetic field in a second plasma area adjacent to the second target. The power supply supplies a first power voltage to the first and second targets. A control anode faces the substrate holder in a second direction, with the first and second plasma areas therebetween, and receives a control voltage greater than the first power voltage.

17 Claims, 6 Drawing Sheets

(51) Int. Cl.
*H01J 37/32* (2006.01)
*H01F 7/02* (2006.01)
*H01F 7/20* (2006.01)

(52) U.S. Cl.
CPC ...... *H01J 37/3405* (2013.01); *H01J 37/3414* (2013.01); *H01J 37/3438* (2013.01); *H01J 37/3452* (2013.01); *H01J 37/3464* (2013.01); *H01J 37/3476* (2013.01); *H01F 7/20* (2013.01)

(58) Field of Classification Search
CPC ............... H01J 37/3405; H01J 37/3414; H01J 37/3438; H01J 37/3452; H01J 37/3464; H01J 37/3476; H01F 7/0273; H01F 7/20
USPC ............. 204/298.14, 298.18, 298.21, 298.22
See application file for complete search history.

(56) References Cited

FOREIGN PATENT DOCUMENTS

| | | | |
|---|---|---|---|
| JP | 2009-293089 | * | 12/2009 |
| JP | 2010-13724 | * | 1/2010 |
| KR | 10-1005204 B1 | | 1/2011 |
| KR | 10-2012-0049554 A | | 5/2012 |

\* cited by examiner

SPUTTERING APPARATUS AND SPUTTERING METHOD USING THE SAME

CROSS-REFERENCE TO RELATED APPLICATION

Korean Patent Application No. 10-2016-0064237, filed on May 25, 2016, and entitled, "Sputtering Apparatus and Sputtering Method Using the Same," is incorporated by reference herein in its entirety.

BACKGROUND

1. Field

One or more embodiments described herein relate to a sputtering apparatus and a sputtering method using a sputtering apparatus.

2. Description of the Related Art

A sputtering apparatus may apply a bias voltage to electrodes inside a chamber. The bias voltage generates an electric field which affects an inert gas to form a plasma. Ions of the plasma are accelerated by the electric field to collide with a target, thereby sputtering the target. Target materials of the sputtered target may be deposited on a substrate.

SUMMARY

In accordance with one or more embodiments, a sputtering apparatus includes a substrate holder; a first counterpart target area, including a first target and at least one first magnetic part, to form a magnetic field in a first plasma area adjacent to the first target; a second counterpart target area, including a second target and at least one second magnetic part, to form a magnetic field in a second plasma area adjacent to the second target, the second counterpart target area spaced from the first counterpart target area in a first direction, with the first and second plasma areas therebetween; a power supply to supply a first power voltage to the first and second targets; and a control anode to face the substrate holder in a second direction crossing the first direction, with the first and second plasma areas therebetween, and to receive a control voltage greater than the first power voltage.

The power supply may alternately supply the first and second power voltages to the first and second targets. The first and second power voltages may be synchronized with a power supply period defined periodically, the first power voltage may be applied to the first target and the second power voltage may be applied to the second target during a first period of the power supply period, and the first power voltage may be applied to the second target and the second power voltage is to be applied to the first target during a second period of the power supply period. The second power voltage may be less than the first power voltage.

The sputtering apparatus may include a control magnetic part which faces the substrate holder in the second direction, with the first and second plasma areas therebetween. The control anode may be between the first plasma area and the control magnetic part and between the second plasma area and the control magnetic part.

The sputtering apparatus may include a plurality of first magnetic parts; and a plurality of second magnetic parts, wherein: first and second poles of the control magnetic part may be sequentially arranged in the first direction; a second pole of a first edge magnetic part most adjacent to the control magnetic part among the first magnetic parts may be closer to the first pole of the control magnetic part than a first pole of the first edge magnetic part; and a first pole of a second edge magnetic part most adjacent to the control magnetic part among the second magnetic parts may be closer to the second pole of the control magnetic part than a second pole of the second edge magnetic part. Magnetic poles of the first and second magnetic parts, which face to each other, may have opposite polarities. The control anode may surround the control magnetic part.

The sputtering apparatus may include a yoke between the control magnetic part and the first plasma area, wherein the yoke is between the control magnetic part and the second plasma area and includes a magnetic field shielding material. The following condition may be satisfied:

$$\theta_E < \theta_M,$$

wherein the $\theta_E$ is an erosion angle of the magnetic field generated by the first magnetic part and the $\theta_M$ is a reference angle defined as an angle formed by a virtual line connected to the control anode from the first magnetic part and a normal line perpendicular to the first magnetic holder substrates. The control anode may be spaced from the first and second counterpart target areas in the first direction.

The first counterpart target area may include a first magnetic holder substrate and a first rotator to rotate the first magnetic holder substrate, the second counterpart target area may include a second magnetic holder substrate and a second rotator to rotate the second magnetic holder substrate, the at least one first magnetic part and at least one second magnetic part on the first and second magnetic holder substrates, respectively.

The first and second counterpart target areas respectively may include first and second target holders having side surfaces parallel to a third direction perpendicular to the first and second directions, and the first and second targets may be respectively provided to side surfaces of the first and second target holders.

In accordance with one or more other embodiments, a sputtering deposition method uses a sputtering apparatus, which includes a first magnetic part to form a magnetic field in a first plasma area adjacent to a first target and a second magnetic part spaced from the first plasma area in a first direction and to form a magnetic field in a second plasma area adjacent to a second target.

The method includes providing a substrate to a substrate holder; applying power to the first and second targets to form a plasma in the first and second plasma area; applying a control voltage which is greater than a first power voltage to a control anode facing the substrate holder in a second direction crossing the first direction, with the first and second plasma areas therebetween, the first power voltage of the power supply lower than a preset first target voltage and a first power current of the power supply greater than a preset first target current; and sputtering the first and second targets using the plasma so that target materials of first and second targets are deposited on the substrate.

Applying the power supply includes sequentially and alternately providing, to the first and second targets, the first power voltage and a second power voltage lower than the first power voltage. In applying the control voltage, the second power voltage is less than a preset second target voltage, and a second power current of the power is less than a preset second target current.

The first and second power voltages are supplied in synchronization with a power supply period which is periodically defined; during a first period of the power supply period, the first power voltage is applied to the first target and the second power voltage is applied to the second target; and during a second period of the power supply period, the first power voltage is applied to the second target and the second power voltage is applied to the first target.

The method may include rotating at least one of the first or second magnetic holder substrates, wherein the first and second magnetic parts are on the first and second magnetic holder substrates, respectively. The first magnetic holder substrate may rotate the first magnetic holder substrate to satisfy the condition of $\theta_E < \theta_M$; wherein the $\theta_E$ is an erosion angle of the magnetic field generated by the first magnetic part, and the $\theta_M$ is a reference angle defined as an angle formed by a virtual line connected to the control anode from the first magnetic part and a normal line perpendicular to the first magnetic holder substrates.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
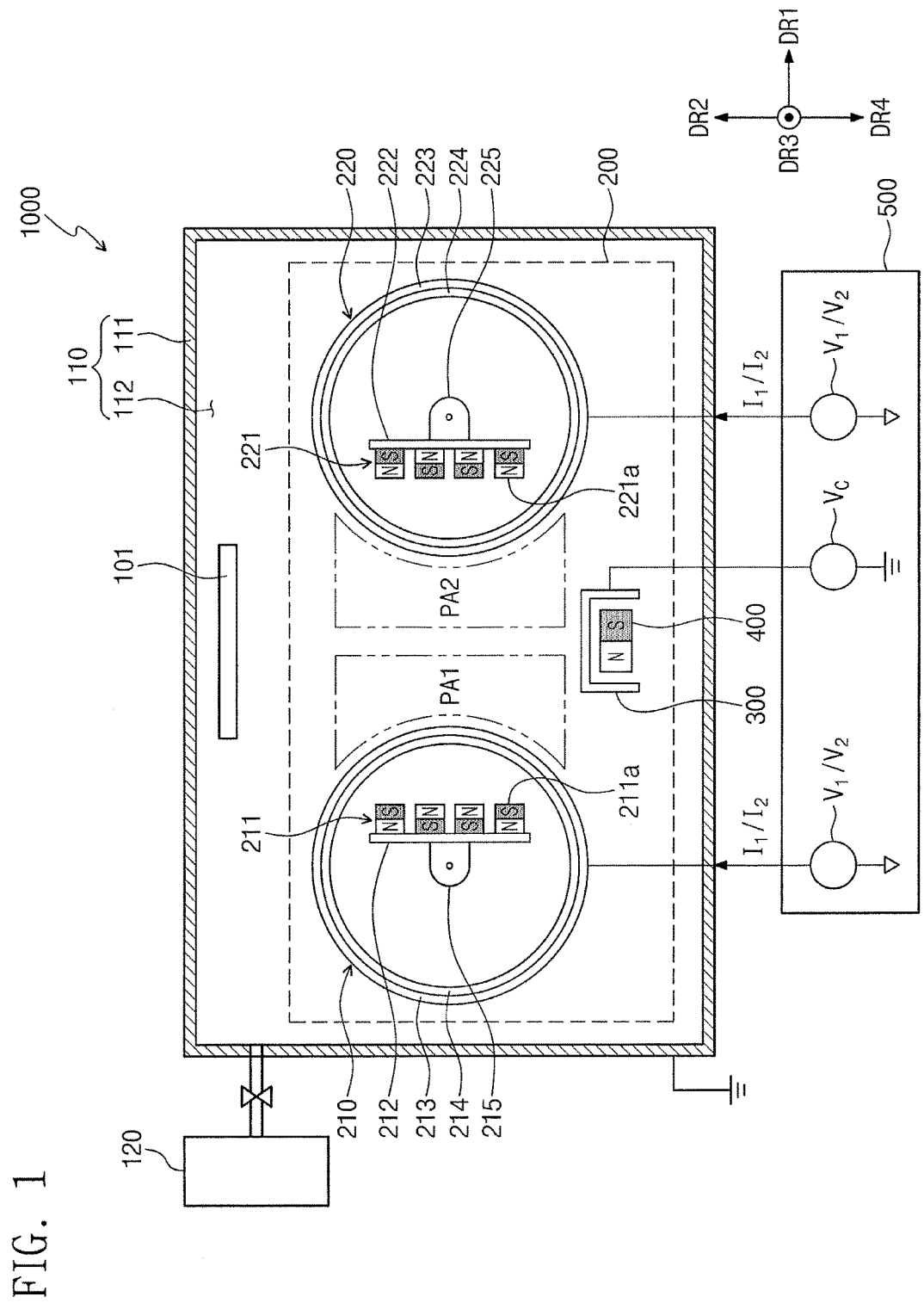
FIG. 1 illustrates an embodiment of a sputtering apparatus.

Example embodiments will now be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a sputtering apparatus 1000 which includes a substrate holder 101, a process chamber 110, a gas supply unit 120, a sputtering unit 200, a control anode 300, a control magnetic part 400, and a power supply unit 500.

The process chamber 110 includes a chamber wall 111. A reaction space 112 surrounded by the chamber wall 111 may be included in the chamber wall 111. The reaction space 112 may include the substrate holder 101, the sputtering unit 200, and the control anode 300. Sputtering and deposition processes may be performed in the reaction space 112. In an embodiment, a reference voltage may be applied to the chamber wall 111. The reference voltage may be, for example, a ground voltage GND, e.g., 0 Volt.

In an example, the gas supply unit 120 may be outside the process chamber 110 and may supply gas for generating a plasma to the reaction space 112. The gas supply unit 120 may be connected, for example, to the reaction space 112 through an opening in the chamber wall 111 and may supply the gas to the reaction space 112 through the opening. The gas may include, for example, an inert gas such as argon (Ar) or a reactive gas such as oxygen ($O_2$).

The sputtering unit 200 may include a first counterpart target unit 210 and a second counterpart target unit 220. The first counterpart target unit 210 may include a first magnetic part 211, a first magnetic holder substrate 212, a first target 213, a first target holder 214, and a first rotating unit 215.

The first target holder 214 may have a cylindrical shape. For example, the first target holder 214 may include an upper surface, a lower surface, and a side surface connected to the upper and lower surfaces. The side surface may be parallel to a third direction DR3 perpendicular to first and second directions DR1 and DR2. The upper and lower surfaces may be perpendicular to the third direction DR3. The first and second directions DR1 and DR2 may cross, and, for example, may be orthogonal to each other.

The first target 213 is on the first target holder 214. For example, the first target 213 may be on the entire side surface of the first target holder 214. The first target 213 may correspond to a portion of the side surface of the first target holder 214, e.g., the portion facing the second counterpart target unit 220.

The first target 213 may include a target material to be deposited on the substrate holder 101. The target material may include, for example, Li, Ca, LiF/Ca, LiF/Al, Al, Mg, BaF, Ba, Ag or a composite thereof or a mixture thereof (for example, a mixture of Ag and Mg), or may include, for example, ITO (indium tin oxide), IZO (indium zinc oxide), ZnO (zinc oxide), ITZO (indium tin zinc oxide), Mo, Ti or the like.

The first magnetic part 211 may be, for example, a permanent magnet having a first pole and a second pole, e.g., an N pole and an S pole, respectively. The first magnetic part 211 may be, for example, an electromagnet. In one embodiment, a plurality of first magnetic parts 211 may be arranged on the first magnetic holder substrate 212 and spaced apart from each other by a predetermined distance in the second direction DR2.

The first magnetic part 211 forms a magnetic field in a first plasma area PA1 proximate to the first target 213. The first plasma area PA1 may be, for example, between the first target 213 and a second plasma area PA2.

Since the first rotating unit 215 is coupled to the first magnetic holder substrate 212 to rotate the first magnetic holder substrate 212, distribution of magnetic force lines inside the first plasma area PA1 by the first magnetic part 211 may be changed.

The second counterpart target unit 220 may include a second magnetic part 221, a second magnetic holder substrate 222, a second target 223, a second target holder 224, and a second rotating unit 225. The second target holder 224 may have, for example, a cylindrical shape. In one embodiment, the shapes of the first and second target holders 214 and 224 may have shapes different from a cylindrical shape, provided the first and second targets 213 and 223 face each other.

The second target 223 is on the second target holder 224 and, for example, may be on the entire side surface of the second target holder 224. The second target 223 may correspond to a portion of the side surface of the second target holder 224, e.g., the portion facing the first counterpart target unit 210. The second target 223 may include a target material, e.g., the same target material as the target material which the first target 213 includes.

The second magnetic part 221 may be, for example, a permanent magnet. In one embodiment, the second magnetic part 221 may be an electromagnet. In one embodiment, a plurality of second magnetic parts 221 may be provided. For example, the second magnetic part 221 may be provided in four pieces. The second magnetic parts 221 may be arranged on the second magnetic holder substrate 222 and spaced apart from each other by a predetermined distance in the second direction DR2.

The second magnetic part 221 forms a magnetic field in a second plasma area PA2 proximate to the second target 223. The second plasma area PA2 may be, for example, between the first plasma area PA1 and the second target 223.

Magnetic poles of the first and second magnetic parts 211 and 221 that are facing each other may have opposite polarities. For example, a second pole of the first magnetic part 211, which is most adjacent in the second direction DR2 among the first magnetic parts 211, may face a first pole of the second magnetic part 221, which is most adjacent in the second direction DR2 among the second magnetic parts 221.

Since the second rotating unit 225 is coupled to the second magnetic holder substrate 222 to rotate the second magnetic holder substrate 222, distribution of magnetic force lines inside second plasma area PA2 by second magnetic part 221 may be changed.

The control magnetic part 400 may face the substrate holder 101 in the second direction DR2, with the first and second plasma areas PA1 and PA2 therebetween. For example, the substrate holder 101 may be in the first and second plasma areas PA1 and PA2 spaced in the second direction DR2. The control magnetic part 400 may be in the first and second plasma areas PA1 and PA2 spaced in a fourth direction DR4 opposed to the second direction DR2.

The control magnetic portion 400 may be, for example, a permanent magnet. In an embodiment, the control magnetic portion 400 may be an electromagnet. First and second poles of the control magnetic part 400 may be, for example, arranged along the first direction DR1.

The first magnetic part most adjacent to the control magnetic part 400 among the first magnetic parts 211 may be defined as a first edge magnetic part 211a. The distance from a second pole of the first edge magnetic part 211a to the first pole of the control magnetic part 400 may be less than the distance from a first pole of the first edge magnetic part 211a to the first pole of the control magnetic part 400. Accordingly, magnetic force lines connecting the second pole of the first edge magnetic part 211a and the first pole of the control magnetic part 400 may be formed.

Similarly, the second magnetic part most adjacent to the control magnetic part 400 among the second magnetic parts 221 may be defined as a second edge magnetic part 221a. The distance from a first pole of the second edge magnetic part 221a to the second pole of the control magnetic part 400 may be less than the distance from a second pole of the second edge magnetic part 221a to the second pole of the control magnetic part 400. Thus, magnetic force lines may be formed connecting the first pole of the second edge magnetic part 221a and the second pole of the control magnetic part 400.

The control anode 300 may face the substrate holder 101 in the second direction DR2, with the first and second plasma areas PA1 and PA2 therebetween. For example, the control anode 300 may be spaced apart in the fourth direction DR4 from the first and second plasma areas PA1 and PA2. In one embodiment, the control anode 300 may be spaced from the first and second counterpart target units 210 and 220 in a direction parallel to the first direction DR1. Thus, the control anode 300 may not overlap the first and second counterpart target units 210 and 220 in the second direction DR2.

The control anode 300 may be between the first and second plasma areas PA1 and PA2 and the control magnetic part 400. Also, the control anode 300 may be between the first and second counterpart target units 210 and 220 and control magnetic part 400.

The power supply unit 500 supplies power to the first and second counterpart target units 210 and 220. For example, the power supply unit 500 may supply first and second power to the first and second targets 213 and 223. The power supply unit 500 may supply the first power by applying a first power voltage V1 and a first power current I1, and may supply the second power by applying a second power voltage V2 and a second power current I2. First electric power of the first power may be based on the product of the first power voltage V1 and the first power current I1. Second electric power of the second power may be based on the product of the second power voltage V2 and the second power current I2.

When the first and second power supplies are applied to the first and second targets 213 and 223, a plasma is formed in the first and second plasma areas PA1 and PA2, and thus sputtering may begin. The greater the first and second powers, the higher the density of the plasma to be formed. Thus, the deposition rate in the sputtering process may increase.

Figure 2:
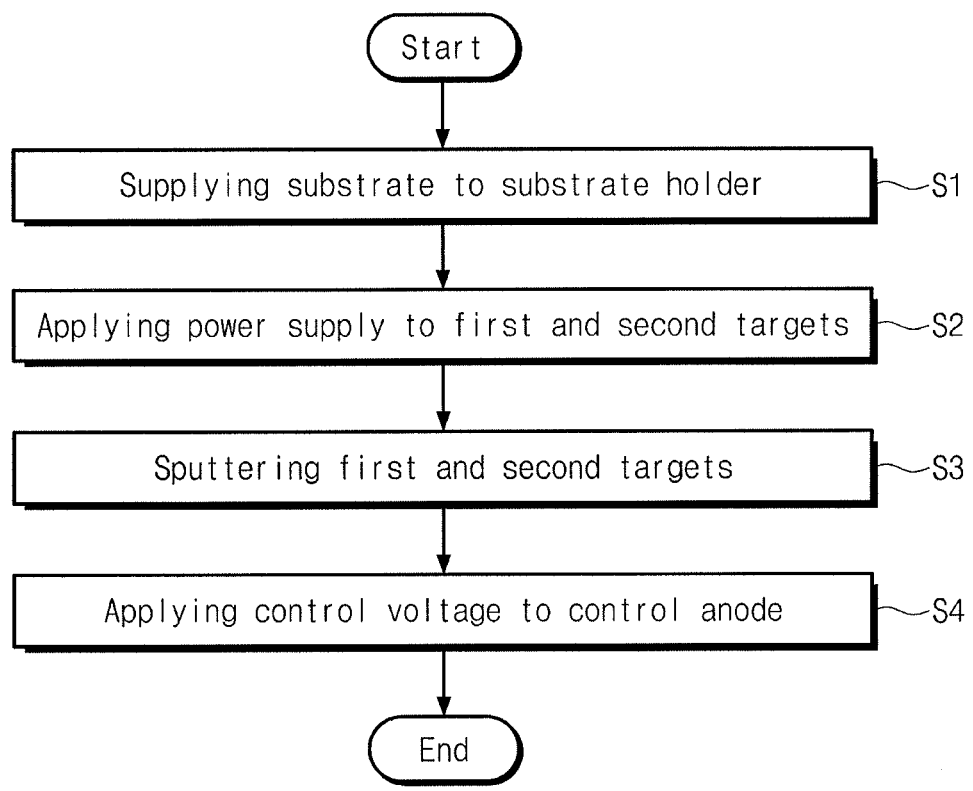
FIG. 2 illustrates an embodiment of a sputtering method.
Figure 3A:
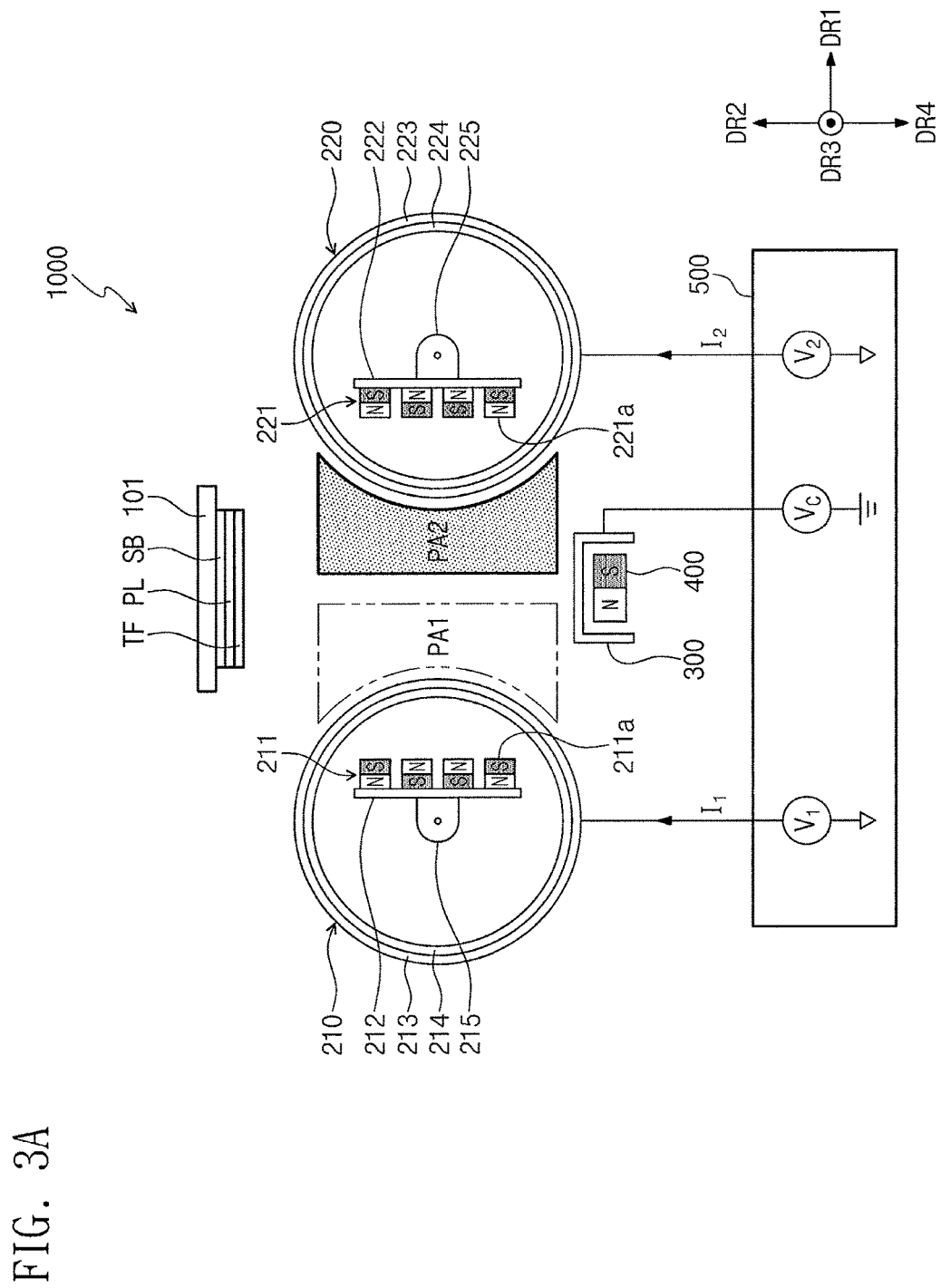
FIGS. 3A and 3B illustrate cross-sectional views of a sputtering apparatus.
Figure 3B:
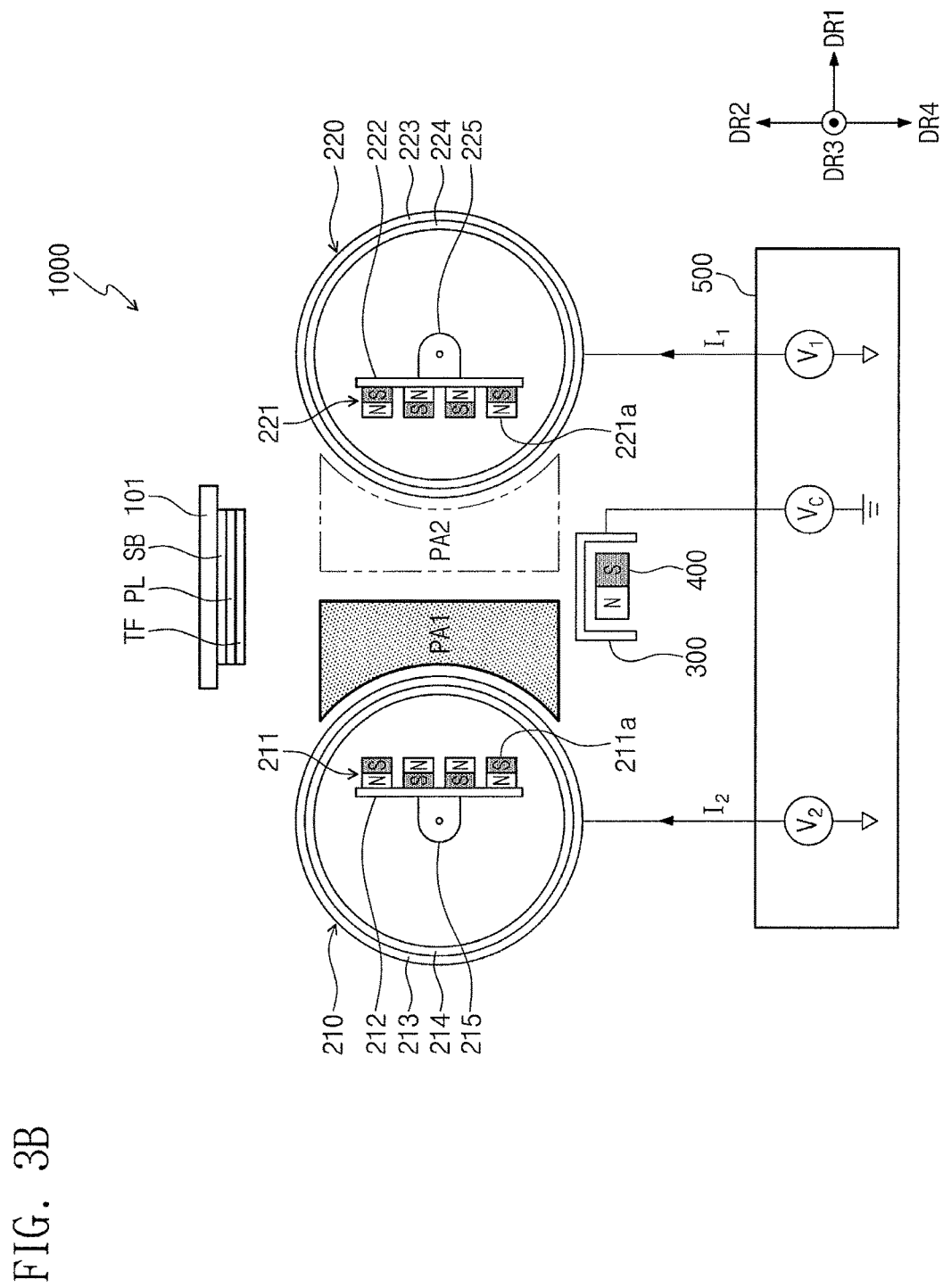
Figure 4:
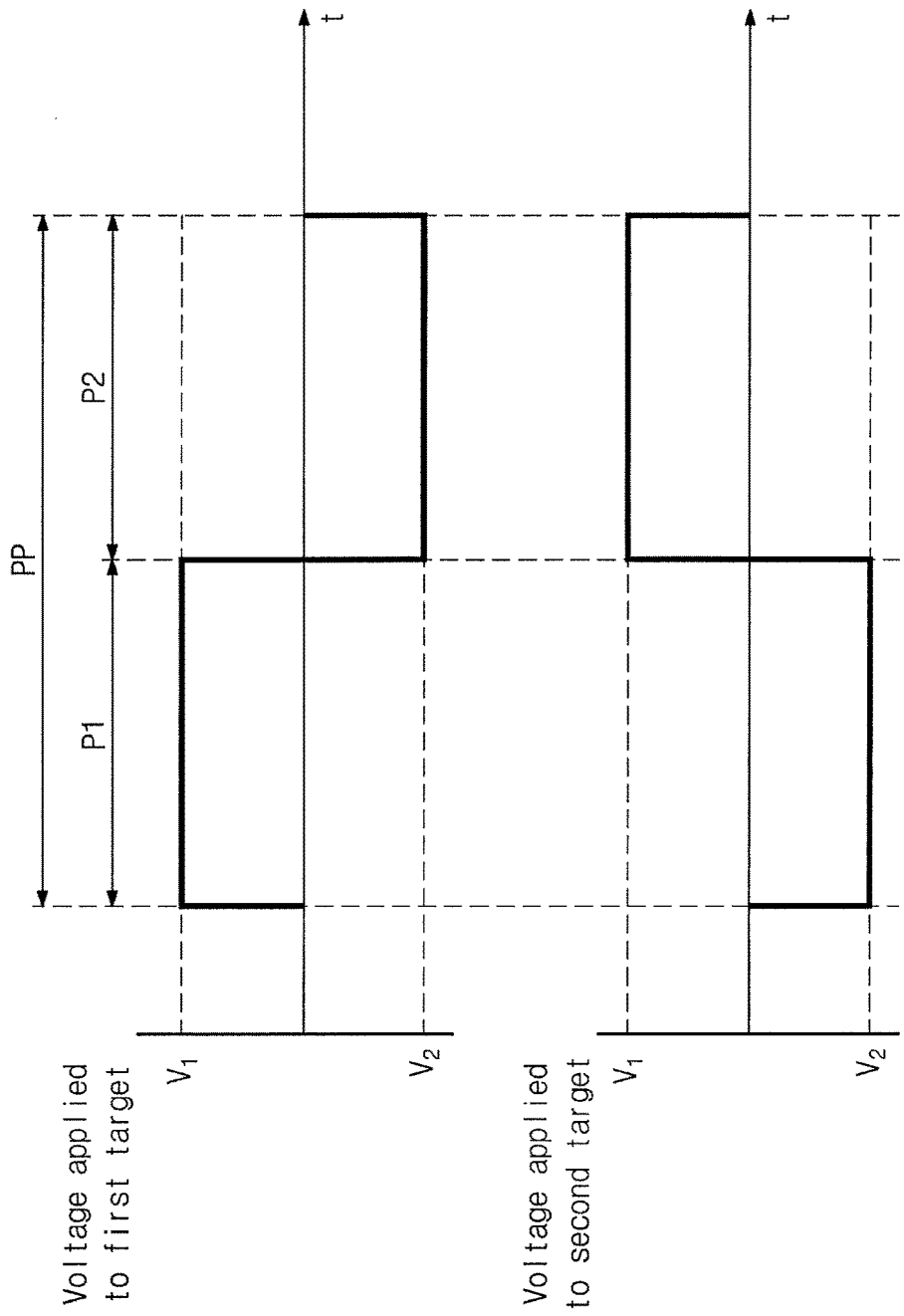
FIG. 4 illustrates an embodiment of a timing chart for the sputtering apparatus in FIGS. 3A and 3B.

FIG. 2 illustrates an embodiment of a sputtering method. FIGS. 3A and 3B are cross-sectional views showing example operations of a sputtering apparatus, which, for example, may be the sputtering apparatus in FIG. 1. FIG. 4 illustrates an embodiment of a timing chart for the sputtering apparatus in FIGS. 3A and 3B.

Referring to FIGS. 2 and 3A, a substrate SB is provided on the substrate holder 101 (S1). The substrate SB may be, for example, a glass or plastic substrate having flexibility. In an example, a layer PL formed in advance may be disposed on the substrate SB. One or a plurality of layers of organic material and/or inorganic material may be provided between the layer PL and the substrate holder 101.

Magnetic fields are respectively formed by the first and second magnetic parts 211 and 221 in the first and second plasma areas PA1 and PA2.

The power supply unit 500 supplies power to the first and second targets 213 and 223 (S2). A plasma may be formed and maintained in the first and second plasma areas PA1 and PA2 by the electricity supplied by the power. Ions of the plasma collide with the first and second targets 213 and 223 for sputtering the first and second targets 213 and 223 (S3). In an example, the power supply unit 500 may apply the first and second power voltages V1 and V2 to the first and second targets 213 and 223. The second power voltage V2 may be, for example, lower than the first power voltage V1.

The power supply unit 500 may, for example, sequentially and alternately supply the first and second power voltages V1 and V2. For example, the first power voltage V1 may be a positive voltage in an approximate range from several volts [V] to tens of volts [V], and the second power voltage V2 may be a negative voltage in an approximate range from—several tens of volts [V] to—several hundreds of volts [V]. The positive voltage may be, for example, a higher voltage than the ground voltage. The negative voltage may be, for example, a lower voltage than the ground voltage.

Referring to FIG. 4, the first and second power voltages V1 and V2 may be provided in synchronization with a power supply period PP, which is periodically defined. The power supply period PP includes first and second periods P1 and P2 which are sequentially defined.

Referring to FIG. 3A, during the first period P1, the first power voltage V1 is applied to the first target 213 and the second power voltage V2 of the power supply period PP is applied to the second target 223. Since the first power voltage V1 may be several volts [V] to several tens of volts [V] and the second power voltage V2 may be—several tens of volts [V] to—several hundreds of volts [V], energy of cations from the first target 213 may be greater than the energy of anions from the second target 223.

Thus, a strong plasma may be formed in the second plasma area PA2. In this case, a second sheath area may occur between the second plasma area PA2 and the second target 223, and most of the electric field may be concentrated on the second sheath area. Anions and electrons are moved to the second target 223 by the electric field to sputter the second target 223.

Further, the ions and electrons of the plasma may be constrained by a magnetic field generated in the second plasma area PA2. For example, the ions and electrons of the plasma may rotate centered on magnetic force lines of the magnetic field by the Lorentz's force. As a result, plasma density in the second plasma area PA2 may be improved.

Referring to FIG. 3B, during the second period P2, the first power voltage V1 is applied to the second target 223 and the second power voltage V2 is applied to the first target 213. Consequently, a strong plasma may be formed in the first plasma area PA1. In this case, a first sheath area may occur between the first plasma area PA1 and the first target 213, and most of the electric field may be concentrated on the first sheath area. The ions and electrons are moved to the first target 213 by the electric field to sputter the first target 213.

Further, the ions and electrons of the plasma may be constrained by a magnetic field generated in the first plasma area PA1. For example, the ions and electrons of the plasma may rotate centered on the magnetic force lines of the magnetic field by the Lorentz's force. As a result, plasma density in the first plasma area PA1 may be improved.

Sputtered target materials are moved from the first and second targets 213 and 223 to the substrate SB, and a thin film TF including the target materials may be deposited on the layer PL (S5).

Accordingly, the first and second power voltages V1 and V2 are provided to the first and second targets 213 and 223, such that the first and second targets 213 and 223 are alternately sputtered. As a result, sputtering efficiency may be improved. For example, as the plasma is alternately concentrated on the first and second plasma areas PA1 and PA2, the ions accumulated on the first and second targets 213 and 223 are removed. Plasma density may therefore be improved. As the plasma density is improved, the amount of the target materials sputtered to the first and second targets 213 and 223 increases, and the deposition rate of the thin film TF may increase.

As the intensity of the electric field within the first and second sheath areas increases, the energy of the plasma particles may increase and a portion of the plasma particles may be provided towards the substrate SB. For example, oxygen anions (for example, $O^-$ or $O_2^-$) of the plasma particles may be accelerated by the electric field to have energy of hundreds of electronvolts [eV]. The oxygen anions may be moved towards the substrate SB after colliding with the first and second targets 213 and 223. As a result, the layer PL may be damaged by the oxygen ions.

Particularly, when the layer PL is an organic film in an organic device (for example, an organic light emitting device), the binding energy of carbon of the organic film is several to tens of electronvolts [eV] less than the energy of the oxygen ions. Thus, the carbon bond of the organic film may be broken to damage the organic film. Accordingly, a defect may occur in the organic film while the thin film is deposited on the organic film by using the sputtering apparatus 1000.

In accordance with the present embodiment, the control anode 300 may effectively reduce the damage which may be applied to the layer PL. For example, a control voltage $V_C$ which is higher than the first power voltage V1 may be applied to the control anode 300 (S4). The first power voltage V1 may be, for example, supplied by the power supply unit 500. For example, the first power voltage V1 may be supplied by a power supply device separate from the power supply unit 500. Another end of the power supply supplying the control voltage $V_C$ may be grounded.

Since the control voltage $V_C$ is applied, the anions of the plasma may be moved towards the control anode 300. Accordingly, the first and second currents I1 and I2 may increase. As a result, when the first and second electric powers that are identical to each other are supplied, the first and second power voltages V1 and V2 may decrease, so that the intensity of the electric field decreases and the energy of the plasma anions decrease. Thus, damage to the layer PL may be effectively prevented or reduced.

In one embodiment, energy of the anions of the plasma may be reduced by 20% to 30%. In this case, the probability of the damage which may be applied to the layer PL may be significantly reduced. In one example, the holder substrate 101 may not be grounded but floated. As a result, the layer PL may be less affected by the plasma.

Furthermore, most of anions may be concentrated on the second plasma area PA2 during the first period P1. The anions of the plasma concentrated on the second plasma area PA2 and the second sheath area may move towards the control anode 300. While moving toward the control anode, the anions of the plasma may collide with other particles to increase the plasma density of the second plasma area PA2.

Also, since the anions of the plasma are moved toward the control anode 300, the probability which the anions of the plasma move towards the substrate SB may be reduced. Accordingly, damage to the layer PL may be effectively prevented or reduced.

In this case, the control anode 300 may not have a great influence on electrons in the second plasma area PA2. Having less mass than the mass of the anions of the plasma, the electrons of the plasma may be strongly constrained by the magnetic field to continuously form a plasma in the second plasma area PA2 without departing the second plasma area PA2.

The sputtering of the first and second targets 213 and 223 (S3) may be performed before the applying the control voltage $V_C$ (S4). In another embodiment, the applying the control voltage $V_C$ (S4) may be performed before sputtering the first and second targets (S3) or the applying power supply to the first and second targets 213 and 223 (S2).

Figure 5:
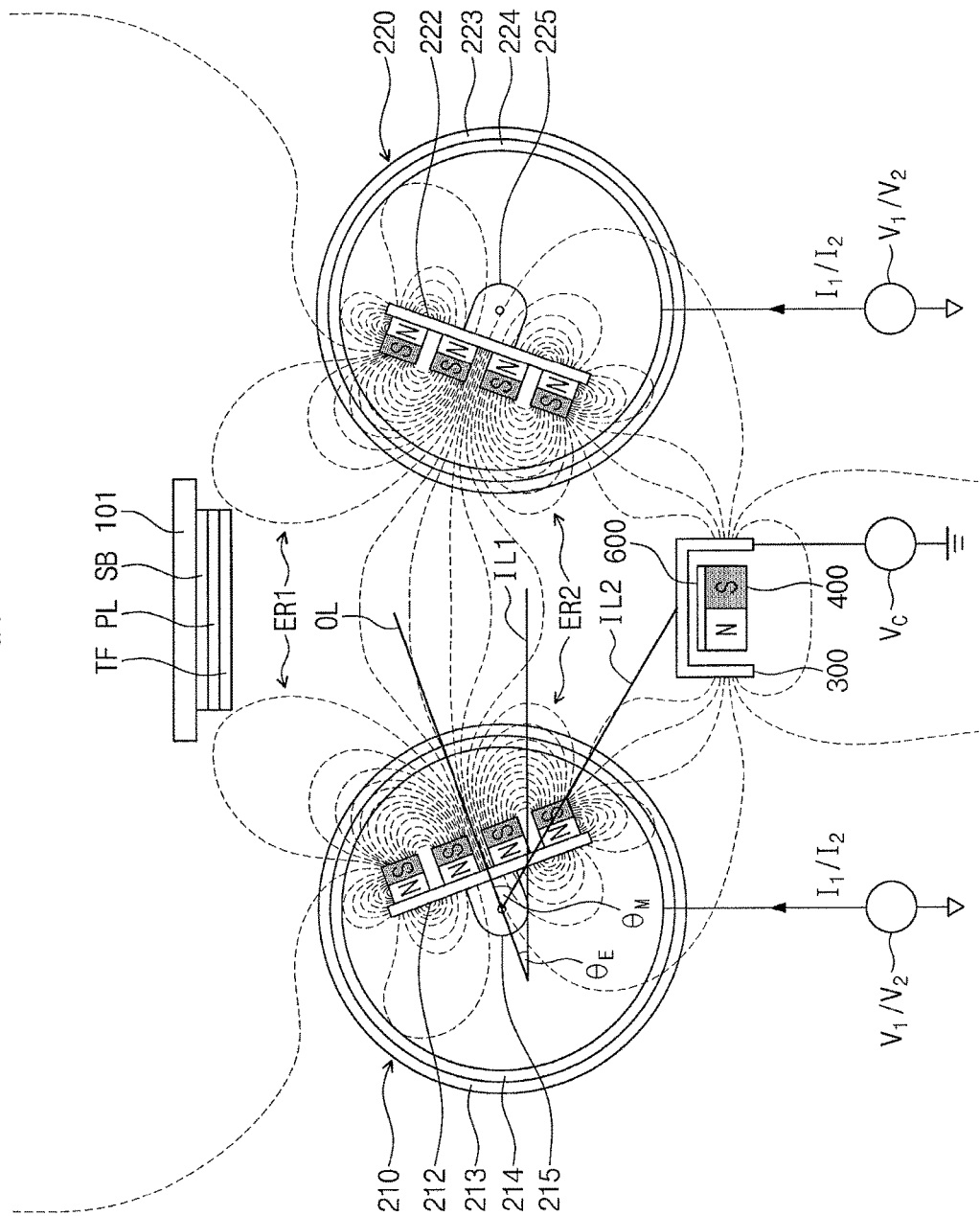
FIG. 5 illustrates an example of a line of magnetic force formed inside a sputtering apparatus.

FIG. 5 illustrates an example of magnetic force lines inside a sputtering apparatus. Referring to FIG. 5, as previously described, the magnetic force lines are connected between the control magnetic part 400 and the first and second edge magnetic parts 211A and 211B. Accordingly, the anions in the first and second plasma areas PA1 and PA2 may more effectively move towards the control anode 300 by the magnetic force lines. As a result, first and second power currents I1 and I2 may be more effectively reduced.

In one example, the first and second rotating units 215 and 225 may rotate the first and second magnetic holder substrates 212 and 222 respectively to control the distribution of the magnetic field.

Referring to FIG. 5, erosion areas ER1 and ER2 and an erosion angle $\theta_E$ may be defined in the magnetic field generated by the first and second magnetic parts 211 and 221. The magnetic force lines (e.g., a parallel magnetic field) of the magnetic field in the erosion areas ER1 and ER2 may be substantially parallel to the first and second magnetic holder substrates 212 and 222. Plasma may be concentrated on the erosion area ER by the parallel magnetic field.

The erosion angle $\theta_E$ may correspond to an angle which forms a first virtual line IL1 connecting a magnetic force line, which is parallel to the first and second magnetic holder substrates 212 and 222, to a normal line OL perpendicular to the first and second magnetic holder substrates 212 and 222. Also, the erosion area in the fourth direction DR4 of the erosion areas ER1 and ER2 may be defined as the second erosion area ER2.

In one example, the first and second rotating units 215 and 225 may rotate the first and second magnetic holder substrates 212 and 222 in counterclockwise direction and in clockwise direction respectively by the erosion angle $\theta_E$.

In one embodiment, a reference angle $\theta_M$ may correspond to an angle formed by a second virtual line IL2 connected to the control anode 300 from the first and second magnetic parts 211 and 221 and a normal line OL perpendicular to the first and second holder substrates 212 and 222.

The erosion angle $\theta_E$ and the reference angle $\theta_M$ may, for example, satisfy the following condition:

$$\theta_E < \theta_M$$

Consequently, the second erosion area ER2 of the first and second magnetic parts 211 and 221 may not face the control anode 300, and the first and second magnetic parts 211 and 221 may face each other. A portion of the magnetic force lines in the second erosion area ER2 of the first magnetic part 211 may be connected to a portion of the magnetic force lines in the second erosion area ER2 of the second magnetic part 221. Accordingly, plasma density in the first and second plasma areas PA1 and PA2 may increase, and thus sputtering efficiency may decrease.

When the second erosion area ER2 of the first and second magnetic parts 211 and 221 faces the control anode 300, most of the magnetic force lines in the second erosion area ER2 are connected to the control anode 300. Thus, the plasma density in the first and second plasma areas PA1 and PA2 may decrease.

In one embodiment, the sputtering apparatus 1000 may further include a yoke 600 between the control magnetic part 400 and the first and second plasma areas PA1 and PA2. The yoke 600 may correspond to first and second poles of the control magnetic part 400.

The yoke 600 may control distribution of a magnetic field generated in the control magnetic part 400. For example, the yoke 600 may block the magnetic field generated in the control magnetic part 400 so that the magnetic field generated in the control magnetic part 400 does not extend up to the first and second plasma areas PA1 and PA2. The yoke 600 may include, for example, a shielding material (e.g., iron) to shield the magnetic field.

The yoke 600 may, for example, expose a portion of side surfaces of the first and second poles of the control magnetic part 400, so that the control magnetic part 400 may be connected to the first and second magnetic parts 211 and 221.

In one embodiment, the control voltage $V_C$ may be higher than the first power voltage V1. In another embodiment, the control voltage $V_C$ may be lower than the first power voltage V1 and higher than the second power voltage V2. In this case, the first and second power currents I1 and I2, the first and second power voltages V1 and V2, energy of anions of plasma, and deposition rate considered for properties of the target material and the layer PL (see FIG. 3A) may be controlled by the control voltage $V_C$.

In one embodiment, the first power voltage V1 may become lower than a preset first target voltage, and the first power current I1 of the power supply may become higher than a preset first target current. Also, the second power voltage V2 may become lower than a preset second target voltage, and the second power current I2 may become lower than a preset second target current. The first and second target voltages and the first and second target currents may be preset such that damage is not applied to the layer PL. The first and second power voltages V1 and V2 may become lowered in a sense that absolute values of the first and second power voltages V1 and V2 become smaller.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The signal generators, voltage generators, and other signal processing features of the disclosed embodiments may be implemented in logic which, for example, may include hardware, software, or both. When implemented at least partially in hardware, the signal generators, voltage generators, and other signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the signal generators, voltage generators, and other signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a sputtering apparatus includes a control anode that increases power current of a power supply for generating plasma. Accordingly, the power voltage of the power supply may be decreased, and thus energy of particles inside the plasma may decrease. As a result, damage to a substrate and thin films (formed in advance on the substrate) by particles may be reduced or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A sputtering apparatus, comprising:
    a substrate holder;
    a first counterpart target area, including a first target and at least one first magnetic part, to form a magnetic field in a first plasma area adjacent to the first target;
    a second counterpart target area, including a second target and at least one second magnetic part, to form a magnetic field in a second plasma area adjacent to the second target, the second counterpart target area spaced from the first counterpart target area in a first direction, with the first and second plasma areas therebetween;
    a power supply to supply a first power voltage to the first and second targets; and
    a control anode to face the substrate holder in a second direction crossing the first direction, with the first and second plasma areas therebetween, and to receive a control voltage greater than the first power voltage;
    a control magnetic part to face the substrate holder in the second direction, with the first and second plasma areas therebetween, wherein:
    a first pole of the control magnetic part and a second pole of the control magnetic part having a polarity different from the first pole are sequentially arranged in the first direction.

2. The sputtering apparatus as claimed in claim 1, wherein the power supply is to alternately supply the first power voltage and a second power voltage to the first and second targets.

3. The sputtering apparatus as claimed in claim 2, wherein:
    the first and second power voltages are to be synchronized with a power supply period defined periodically,
    the first power voltage is to be applied to the first target and the second power voltage is to be applied to the second target during a first period of the power supply period, and
    the first power voltage is to be applied to the second target and the second power voltage is to be applied to the first target during a second period of the power supply period.

4. The sputtering apparatus as claimed in claim 2, wherein the second power voltage is less than the first power voltage.

5. The sputtering apparatus as claimed in claim 1, wherein:
    the control anode is between the first plasma area and the control magnetic part and between the second plasma area and the control magnetic part.

6. The sputtering apparatus as claimed in claim 1, further comprising:
    a plurality of first magnetic parts; and
    a plurality of second magnetic parts, wherein:
    a second pole of a first edge magnetic part most adjacent to the control magnetic part among the first magnetic parts is closer to the first pole of the control magnetic part than a first pole of the first edge magnetic part; and
    a first pole of a second edge magnetic part most adjacent to the control magnetic part among the second magnetic parts is closer to the second pole of the control magnetic part than a second pole of the second edge magnetic part.

7. The sputtering apparatus as claimed in claim 6, wherein magnetic poles of the first and second magnetic parts, which face to each other, have opposite polarities.

8. The sputtering apparatus as claimed in claim 1, wherein the control anode covers a top surface and side surfaces of the control magnetic part between the first plasma area and the control magnetic part and between the second plasma area and the control magnetic part, the top surface of the control magnetic part being a surface that faces the substrate holder, and
    the control anode does not cover a bottom surface of the control magnetic part, the bottom surface of the control magnetic part being a surface that faces away from the substrate holder.

9. The sputtering apparatus as claimed in claim 1, further comprising:
    a yoke between the control magnetic part and the first plasma area,
    wherein the yoke is between the control magnetic part and the second plasma area and includes a magnetic field shielding material.

10. The sputtering apparatus as claimed in claim 1, wherein the following condition is satisfied:

$$\theta_E < \theta_M,$$

wherein the $\theta_E$ is an erosion angle of the magnetic field generated by the first magnetic part and the $\theta_M$ is a reference angle defined as an angle formed by a virtual line connected to the control anode from the first magnetic part and a normal line perpendicular to the first magnetic holder substrates.

11. The sputtering apparatus as claimed in claim 1, wherein the control anode is spaced from the first and second counterpart target areas in the first direction.

12. The sputtering apparatus as claimed in claim 1, wherein:
the first counterpart target area includes a first magnetic holder substrate and a first rotator to rotate the first magnetic holder substrate,
the second counterpart target area includes a second magnetic holder substrate and a second rotator to rotate the second magnetic holder substrate, and
the at least one first magnetic part and at least one second magnetic part are on the first and second magnetic holder substrates, respectively.

13. The sputtering apparatus as claimed in claim 12, wherein:
the first and second counterpart target areas respectively include first and second target holders having side surfaces parallel to a third direction perpendicular to the first and second directions, and
the first and second targets are respectively provided to side surfaces of the first and second target holders.

14. A sputtering deposition method using a sputtering apparatus, which includes a first magnetic part to form a magnetic field in a first plasma area adjacent to a first target and a second magnetic part spaced from the first plasma area in a first direction and to form a magnetic field in a second plasma area adjacent to a second target, the method comprising:
providing a substrate to a substrate holder;
applying power to the first and second targets to form a plasma in the first and second plasma areas;
applying a control voltage which is greater than a first power voltage to a control anode facing the substrate holder in a second direction crossing the first direction, with the first and second plasma areas therebetween, the first power voltage of a power supply being lower than a preset first target voltage and a first power current of the power supply being greater than a preset first target current;
sputtering the first and second targets using the plasma such that target materials of the first and second targets are deposited on the substrate, and
rotating at least one of first or second magnetic holder substrates, wherein:
the first and second magnetic parts are on the first and second magnetic holder substrates, respectively, and
the first magnetic holder substrate rotates the first magnetic part to satisfy the condition of $\theta_E < \theta_M$; wherein the $\theta_E$ is an erosion angle of the magnetic field generated by the first magnetic part, and the $\theta_M$ is a reference angle defined as an angle formed by a virtual line connected to the control anode from the first magnetic part and a normal line perpendicular to the first magnetic holder substrate.

15. The method as claimed in claim 14, wherein applying the power supply includes sequentially and alternately providing, to the first and second targets, the first power voltage and a second power voltage lower than the first power voltage.

16. The method as claimed in claim 15, wherein in applying the control voltage:
the second power voltage is less than a preset second target voltage, and
a second power current of the power is less than a preset second target current.

17. The method as claimed in claim 15, wherein:
the first and second power voltages are supplied in synchronization with a power supply period which is periodically defined;
during a first period of the power supply period, the first power voltage is applied to the first target and the second power voltage is applied to the second target; and
during a second period of the power supply period, the first power voltage is applied to the second target and the second power voltage is applied to the first target.

* * * * *